US006798811B1

(12) United States Patent
Sugahara et al.

(10) Patent No.: US 6,798,811 B1
(45) Date of Patent: Sep. 28, 2004

(54) SEMICONDUCTOR LASER DEVICE, METHOD FOR FABRICATING THE SAME, AND OPTICAL DISK APPARATUS

(75) Inventors: Gaku Sugahara, Nara (JP); Isao Kidoguchi, Ako (JP); Ryoko Miyanaga, Nara (JP); Masakatsu Suzuki, Hirakata (JP); Masahiro Kume, Otsu (JP); Yusaburo Ban, Hirakata (JP); Fukukazu Hirayama, Ako (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 110 days.

(21) Appl. No.: 09/890,095

(22) PCT Filed: Nov. 29, 2000

(86) PCT No.: PCT/JP00/08461

§ 371 (c)(1),
(2), (4) Date: Jul. 27, 2001

(87) PCT Pub. No.: WO01/41271

PCT Pub. Date: Jun. 7, 2001

(30) Foreign Application Priority Data

Nov. 30, 1999 (JP) .......................................... 11/339195

(51) Int. Cl.$^7$ ................................................ H01S 5/00
(52) U.S. Cl. ............................. 372/49; 372/45; 372/46
(58) Field of Search ............................. 372/49, 45, 46

(56) References Cited

U.S. PATENT DOCUMENTS

| 5,372,874 A | * | 12/1994 | Dickey et al. ............... 428/216 |
| 5,844,931 A | * | 12/1998 | Sagawa et al. ............... 372/45 |
| 5,872,759 A | * | 2/1999 | Yamanaka ............... 369/112.15 |
| 6,081,637 A | * | 6/2000 | Rekow ........................ 385/31 |
| 6,285,702 B1 | * | 9/2001 | Caprara et al. ............... 372/92 |

FOREIGN PATENT DOCUMENTS

| JP | 60-182526 | 9/1985 |
| JP | 01-167231 | 6/1989 |
| JP | 04-299591 | 10/1992 |
| JP | 06-097570 | 4/1994 |
| JP | 06-111792 | 4/1994 |
| JP | 07-7225 | 1/1995 |
| JP | 09-283843 | 10/1997 |
| JP | 10-31106 | 2/1998 |
| JP | 11-186656 | 7/1999 |
| JP | 2000-022269 | 1/2000 |
| JP | 2000-164978 | 6/2000 |
| JP | 2000-216476 | 8/2000 |

OTHER PUBLICATIONS

International Search Report.

Masaru Kuramoto et al., "Room–Temperature Continuous–Wave Operation of InGan Multi–Quantum–Well Laser Diodes Grown on an n–GaN Substrate with a Backside n–Contact", Japanese Journal of Applied Physics, Vo. 38, pp. L184–L196, Feb. 15, 1999.

International Search Report dated Feb. 23, 2001.

* cited by examiner

Primary Examiner—Don Wong
Assistant Examiner—Dung (Michael) T Nguyen
(74) Attorney, Agent, or Firm—McDermott Will & Emery LLP

(57) ABSTRACT

A semiconductor laser device (10) includes a resonant cavity (12) in which a quantum well active layer (11) made up of barrier layers of gallium nitride and well layers of indium gallium nitride is vertically sandwiched between at least light guide layers of n- and p-type aluminum gallium nitride. An end facet reflective film (13) is formed on a reflective end facet (10b) opposite to a light-emitting end facet (10a) in the resonant cavity (12). The end facet reflective film (13) has a structure including a plurality of unit reflective films (130), each of which is made up of a low-refractive-index film (13a) of silicon dioxide and a high-refractive-index film (13b) of niobium oxide. The low-and high-refractive-index films are deposited in this order on the end facet of the resonant cavity (12).

19 Claims, 6 Drawing Sheets

SEMICONDUCTOR LASER DEVICE, METHOD FOR FABRICATING THE SAME, AND OPTICAL DISK APPARATUS

TECHNICAL FIELD

The present invention relates to a semiconductor laser device expectedly applicable to the field of optical information processing, a method for fabricating the device, and an optical disk apparatus in which the semiconductor laser device is used for its light-emitting portion.

BACKGROUND ART

In general, an end facet reflective film is provided on an end facet of the laser light resonant cavity of a semiconductor laser device. Particularly, a reflective end facet, which is a rear end facet opposite to the laser-light-emitting facet, should have a high reflectance. Thus, an end facet reflective film with a high reflectance is formed by alternately stacking low- and high-refractive-index films having thicknesses of $\lambda/4n_1$ and $\lambda/4n_2$, respectively, where $\lambda$ is an oscillation wavelength of the laser light, $n_1$ is a refractive index at the low-refractive-index film at the wave-length of $\lambda$, and $n_2$ is a refractive index of the high-refractive-index film at the wavelength of $\lambda$.

Each of the low- and high-refractive-index films making up the end facet reflective film should have a sufficiently small absorption coefficient at the wavelength of the laser light. Thus, silicon dioxide ($SiO_2$) or aluminum oxide ($Al_2O_3$), each of which has a small absorption coefficient in a wide range covering visible to ultraviolet light parts of the spectrum, is used for the low-refractive-index films in the end facet reflective film. On the other hand, various dielectric materials are usable for the high-refractive-index film in the end facet reflective film depending on the wavelength of the laser light.

For example, in an infrared or red-light-emitting semiconductor laser device of aluminum gallium arsenide (AlGaAs) that outputs a laser beam with a wavelength of about 780 nm, amorphous silicon ($\alpha$-Si) is used for the high-refractive-index films of the device. In this case, the absorption coefficient of amorphous silicon to light with a wavelength of 780 nm is $4 \times 10^4$ cm$^{-1}$.

Exemplary applications of this infrared or red-light-emitting semiconductor laser device to the field of optical disk apparatuses include a laser device for a 4× CD-R (CD-recordable), on which data can be written only once four times faster than normal speed. In the laser device for the 4× CD-R, a multiple pairs of silicon dioxide and amorphous silicon films are stacked as an end facet reflective film for the rear end facet. For example, if the end facet reflective film is made up of two pairs (cycles) of silicon dioxide and amorphous silicon films, the reflectance can be 95%.

By using this end facet reflective film, a laser device for a 4×CD-R can have an optical output of 100 mW in a pulsed drive mode at a duty cycle of 50% or 80 mW in a continuous-wave (CW) drive mode.

On the other hand, titanium oxide ($TiO_2$) is used instead of amorphous silicon for the high-refractive-index films of a red-light-emitting semiconductor laser device of aluminum gallium indium phosphide (AlGaInP) that outputs a laser beam with a wavelength of about 650 nm. Amorphous silicon is not used because of the following reason. If amorphous silicon was used for the end facet reflective film, light absorbed into the amorphous silicon layer would increase because the absorption coefficient of amorphous silicon to light with a wavelength of around 650 nm is high. Due to a rise in temperature caused by this light absorption, the crystallinity of the laser device in the vicinity of the resonant cavity end facet thereof deteriorates, and thus the reliability of the device declines.

In view of this, titanium oxide, having a refractive index sufficiently higher than that of silicon dioxide and an absorption coefficient lower than that of amorphous silicon, is used for the end facet reflective film of the red-light-emitting semiconductor laser device with a wavelength of about 650 nm. The absorption coefficient of amorphous silicon to light with a wavelength of 650 nm is $1 \times 10^5$ cm$^{-1}$, while the absorption coefficient of titanium oxide to light with a wavelength of 650 nm is 2 cm$^{-1}$.

Also, in a violet-light-emitting semiconductor laser device with an oscillation wavelength of about 400 nm, which has now been developed, a stacked structure made up of silicon dioxide and titanium oxide films is used as an end facet reflective film. For example, a semiconductor laser device of aluminum indium gallium nitride (AlInGaN) in which a stack of silicon dioxide and titanium oxide films is used as the end facet reflective film was reported in Jpn. J. Appl. Phys. Vol. 38 (1999) pp. L184–L186. The absorption coefficient of titanium oxide to light with a wavelength of 400 nm is 2400 cm$^{-1}$.

Recently, a semiconductor laser device for an optical disk apparatus has to increase its output power to speed up a recording operation on an optical disk and to decrease its wavelength to increase the recording density.

However, there is a problem that neither the known end facet reflective film as a stack of silicon dioxide and amorphous silicon films for the infrared or red-light-emitting semiconductor laser device with an oscillation wavelength of about 780 nm nor the known end facet reflective film as a stack of silicon dioxide and titanium oxide films for the red-light-emitting semiconductor laser device with an oscillation wavelength of about 650 nm can meet the demand of increasing the output power of laser devices.

Further, there is another problem that the end facet reflective film as a stack of silicon dioxide and titanium oxide films for the violet-light-emitting semiconductor laser device with an oscillation wavelength of about 400 nm cannot meet the demand of decreasing the wavelength of laser devices.

This is because the light, emitted from these semiconductor laser device, is absorbed into the high-refractive-index film at an insufficiently small coefficient. Accordingly, if any of these laser devices increases its output power, the temperature rises markedly due to the increase in the amount of light absorbed into the high-refractive-index film. As a result, the crystallinity of the semiconductor laser devices deteriorates especially in part of the active region near the resonant cavity end facet thereof.

In the same way, if a laser device should have an oscillation wavelength as short as 400 nm or less, it is difficult to operate the device properly with a known end facet reflective film as a stacked structure including silicon dioxide. This is because the absorption coefficient of titanium oxide increases greatly at those short wavelengths.

DISCLOSURE OF INVENTION

It is therefore an object of the present invention to solve these problems of the prior art and obtain an end facet reflective film that can meet the demand of increasing the output power, or decreasing the wavelength, of semiconductor laser devices.

To achieve this object, according to the present invention, niobium oxide ($Nb_2O_5$) is used for a high-refractive-index film in an end facet reflective film for a semiconductor laser device.

Specifically, a first inventive semiconductor laser device includes: a resonant cavity made up of a plurality of semiconductor layers; and a reflective film, which contains niobium oxide and is formed on an end facet of the resonant cavity.

In the first semiconductor laser device, the reflective film formed on the end facet of the resonant cavity contains, for example, niobium oxide having a light absorption coefficient smaller than that of titanium oxide. Thus, a smaller quantity of laser light is absorbed thereto compared to titanium oxide, and a rise in temperature of the reflective film is suppressed. As a result, it is possible to prevent the crystal structure of the semiconductor layers from deteriorating in the vicinity of the end facet of the resonant cavity, and the laser device can increase its output power or decrease its wavelength.

A second inventive semiconductor laser device includes: a resonant cavity made up of a plurality of semiconductor layers; and a reflective film, which is formed on an end facet of the resonant cavity and includes a first dielectric layer and a second dielectric layer having a refractive index greater than that of the first dielectric layer. The second dielectric layer is made of niobium oxide.

The second semiconductor laser device achieves the same effects as those of the first semiconductor laser device. In addition, the reflective film is made up of the high-refractive-index film of niobium oxide and the first dielectric layer with a refractive index smaller than that of niobium oxide. Thus, the reflectance can be increased as intended.

A third inventive semiconductor laser device includes: a resonant cavity made up of a plurality of semiconductor layers; and a reflective film, which is formed on an end facet of the resonant cavity by alternately stacking first and second dielectric layers. Each of the second dielectric layers has a refractive index greater than that of the first dielectric layers. At least one of the second dielectric layers, which is closest to the end facet of the resonant cavity, is made of niobium oxide.

In the third semiconductor laser device, the reflective films of the second semiconductor laser device are stacked a number of times. Accordingly, the reflectance further increases. Moreover, in a laser device with an oscillation wavelength belonging to the red part of the spectrum, a dielectric with a refractive index greater than that of niobium oxide, e.g., titanium oxide, may be used for the second dielectric layer located on the other side of the reflective film that is opposite to the end facet of the resonant cavity, i.e., the outermost second dielectric layer. Then, it is possible to increase the reflectance of the reflective film because the absorption coefficient of titanium oxide is not so high, either, in the red part of the spectrum.

In the second or third semiconductor laser device, the first dielectric layer is preferably made of silicon dioxide or aluminum oxide.

In the first through third semiconductor laser devices, the resonant cavity preferably has an oscillation wavelength of about 400 nm or less.

In the first through third semiconductor laser devices, the semiconductor layers: are preferably made of Group III–V nitride semiconductors.

A first inventive method for fabricating a semiconductor laser device includes the steps of: forming a resonant cavity structure by sequentially depositing a plurality of semiconductor layers on a substrate; exposing an end facet of a resonant cavity on the semiconductor layers by cleaving or etching the substrate on which the semiconductor layers have been deposited; and forming a reflective film containing niobium oxide on the exposed end facet of the resonant cavity.

According to the first method for fabricating a semiconductor laser device, by cleaving or etching a substrate on which a plurality of semiconductor layers have been deposited, the end facet of a resonant cavity is exposed on the semiconductor layers and a reflective film containing niobium oxide is formed on the exposed end facet of the resonant cavity. In this manner, the first inventive semiconductor laser device is formed.

In the first method for fabricating a semiconductor laser device, the step of forming the reflective film preferably includes the step of forming the reflective film as a multi-layer structure including a first dielectric layer with a refractive index smaller than that of niobium oxide and a second dielectric layer of niobium oxide. Then, the second or third inventive semiconductor laser device is formed.

In the first method for fabricating a semiconductor laser device, the reflective film is preferably formed by a sputtering process or a reactive sputtering process.

In the first method for fabricating a semiconductor laser device, the semiconductor layers are preferably made of Group III–V nitride semiconductors.

An inventive optical disk apparatus includes: a light-emitter including a semiconductor laser device; a condensing optical system that condenses laser light emitted from the light-emitter on a storage medium on which data has been recorded; and a photodetector that detects part of the laser light that has been reflected from the storage medium. The semiconductor laser device includes: a resonant cavity made up of a plurality of semiconductor layers; and a reflective film, which contains niobium oxide and is formed on an end facet of the resonant cavity.

In the inventive optical disk apparatus, the semiconductor laser device as the light-emitter includes the reflective film that contains niobium oxide and is formed on the end facet of the resonant cavity. Accordingly, the light-emitter can cope with the demand of increasing the output power, or decreasing the wavelength, of the semiconductor laser device.

BRIEF DESCRIPTION OF DRAWINGS

FIG. 3(*a*) is a graph showing the light absorption coefficient thereof; and FIG. 3(*b*) is a graph showing the refractive index thereof.

BEST MODE FOR CARRYING OUT THE INVENTION

Embodiment 1

A first embodiment of the present invention will be described with reference to the drawings.

Figure 1:
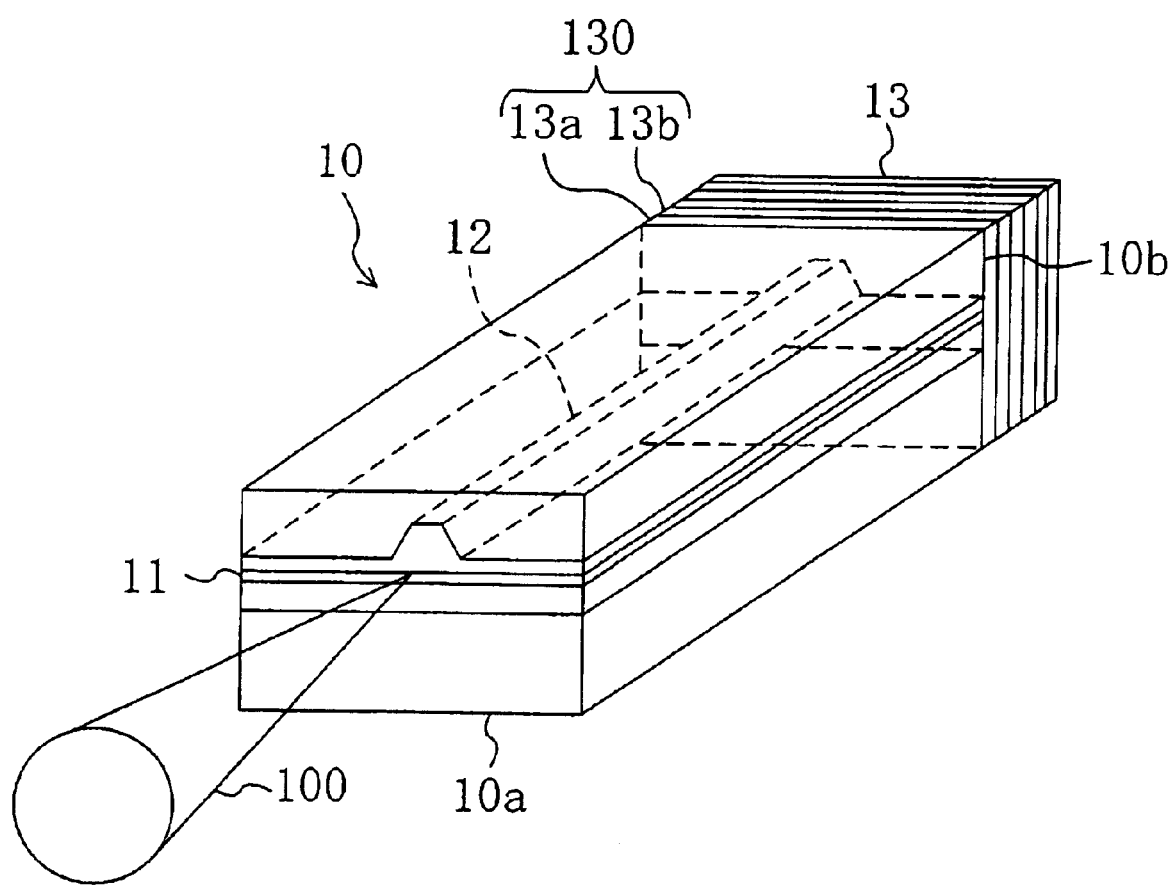
FIG. 1 is a perspective view showing a violet-light-emitting semiconductor laser device according to a first embodiment of the present invention.

FIG. 1 shows a semiconductor laser device according to the first embodiment of the present invention, which is a violet-light-emitting semiconductor laser device with an oscillation wavelength of about 400 nm.

As shown in FIG. 1, the semiconductor laser device 10 includes a resonant cavity 12 in which a quantum well active layer 11 made up of barrier layers of gallium nitride (GaN), for example, and well layers of indium gallium nitride (InGaN), for example, is vertically sandwiched between at least light guide layers of n- and p-type aluminum gallium nitride (AlGaN), for example.

An end facet reflective film 13 is formed on a reflective end facet 10b opposite to a light-emitting end facet 10a for laser light 100 in the resonant cavity 12.

The end facet reflective film 13 has a structure including a plurality of unit reflective films 130, each of which is made up of a low-refractive-index film 13a of silicon dioxide ($SiO_2$) as a first dielectric layer and a high-refractive-index film 13b of niobium oxide ($Nb_2O_5$) as a second dielectric layer. The low- and high-refractive-index films 13a and 13b are deposited in this order on the end facet of the resonant cavity 12.

The thicknesses of the low- and high-refractive-index films 13a and 13b and the number of unit reflective films 130 can be set to respective appropriate values according to the specifications of the semiconductor laser device. For example, if three pairs of unit reflective films 130, each of which is made up of silicon dioxide and niobium oxide films having thicknesses of about 68 nm and about 40 nm, respectively, are formed, the end facet reflective film 13 can have a reflectance of about 93.9%.

In this case, even if titanium oxide ($TiO_2$) is used for the high-refractive-index film 13b as a reflective film for laser light with an oscillation wavelength of about 400 nm as in the know method, the resultant reflectance can be substantially equal to that obtained by niobium oxide.

However, in the first embodiment, niobium oxide is used for the high-refractive-index film 13b of the end facet reflective film 13, and the light absorption coefficient of niobium oxide is lower than that of titanium oxide. Thus, a rise in temperature in the vicinity of the end facet of the resonant cavity 12 can be suppressed. As a result, the crystallinity of the quantum well active layer 1 and the surrounding portions thereof is less likely to deteriorate, and the semiconductor laser device can increase its output power. The active layer has a quantum well structure in the illustrated embodiment but does not have to do so.

Further, the first embodiment is effective not only in increasing its output power but also in decreasing its oscillation wavelength to as short as 400 nm or less belonging to the ultraviolet light part of the spectrum. Specifically, if the unit reflective films 130 of silicon dioxide and titanium oxide are used for an end facet reflective film 13 for an ultraviolet-light-emitting semiconductor laser device, the device will be degraded due to the absorption of light into titanium oxide. In contrast, in the first embodiment, the light absorption coefficient of niobium oxide is smaller than that of titanium oxide even in the ultraviolet light part of the spectrum. Accordingly, degradation of the device because of the decreased wavelength can be suppressed.

The niobium oxide film also serves as a passivation film preventing water, hydrogen, or the like, from externally penetrating and diffusing into the laser device. A Group III–V nitride semiconductor, which is a semiconductor material expectedly applicable to emitting violet light with an oscillation wavelength of about 400 nm, tends to have its electrical properties deteriorated by hydrogen, in particular, by nature. However, in the semiconductor laser device according to this embodiment, one of the resonant cavity end facets is covered with niobium oxide that prevents the penetration of hydrogen. Thus, it is possible to prevent the degradation of the device due to the diffusion of extraneous impurities such as hydrogen.

Hereinafter, a method for fabricating a semiconductor laser device having this structure will be described with reference to the drawings.

Figure 2:
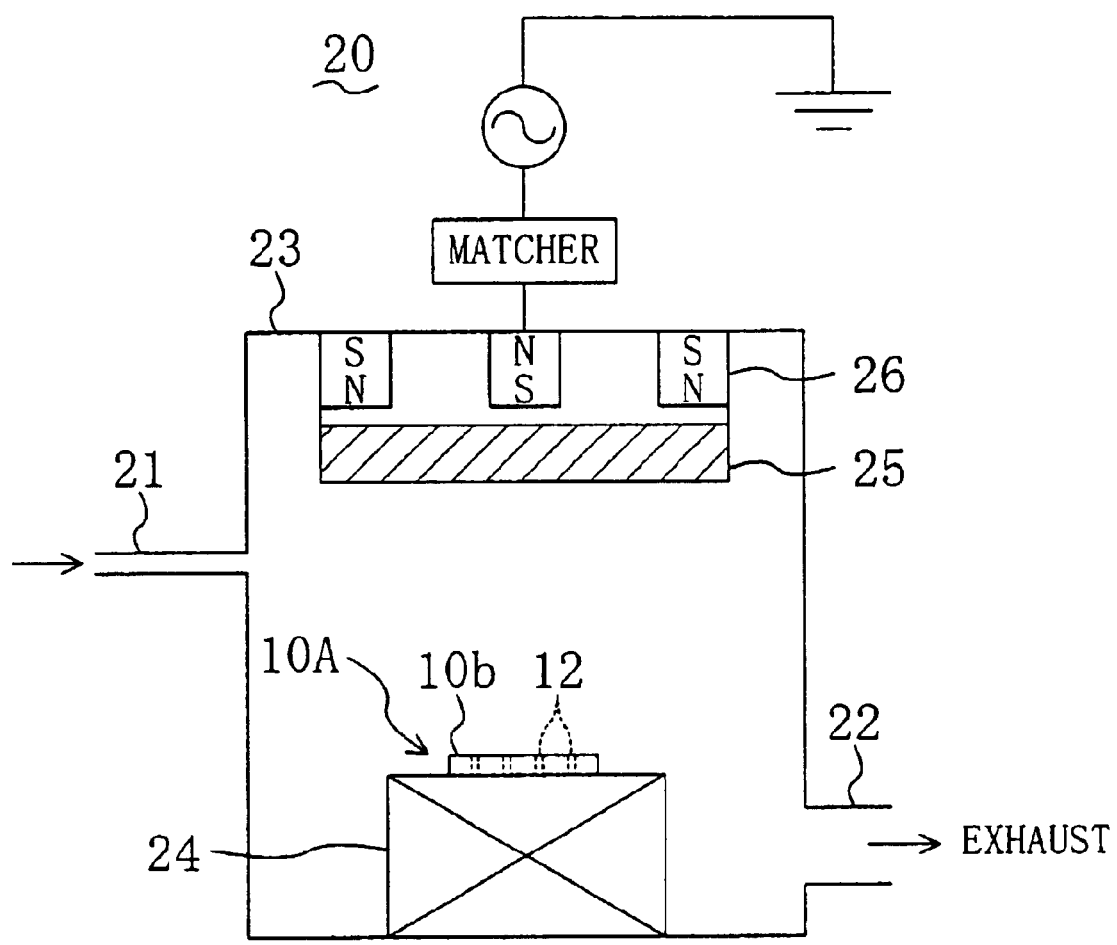
FIG. 2 is a schematic view showing how to make the reflective end facet of the violet-light-emitting semiconductor laser device according to the first embodiment of the present invention.

FIG. 2 schematically shows a method for fabricating a semiconductor laser device according to the first embodiment of the present invention, which is a method for forming an end facet reflective film by a sputtering process. In this case, a magnetron sputtering system, for example, may be used as a sputtering deposition system.

First, a schematic structure of the deposition system will be described.

As shown in FIG. 2, the magnetron sputtering system 20 includes a deposition chamber 23. The chamber 23 has: a gas inlet port 21 in the upper part of a wall thereof; and an outlet port 22 in the lower part of another wall thereof so that the port 22 faces the gas inlet port 21.

An anode 24 is disposed on the bottom of the deposition chamber 23, and a laser device prototype 10A, on which the reflective film should be deposited, is mounted on the anode 24 with the reflective end facets of the resonant cavities 12 facing upward. In this case, the laser device prototype 10A is a striped semiconductor wafer in which multiple resonant cavities 12 have been formed. And the laser device prototype 10A has been cleaved in a direction substantially vertical to the length of the resonant cavities to expose the reflective end facets 10b.

A plate magnetron electrode 26, on which a plate target member 25 of niobium oxide ($Nb_2O_5$) is placed to face the anode 24, is disposed on the ceiling of the deposition chamber 23. Thus, the exposed reflective end facets 10b of the laser device prototype 10A face the target member 25.

Next, a deposition method will be described.

First, a plasma generating gas, containing argon (Ar) as a main component, is introduced through the gas inlet port 21 into the deposition chamber 23, with a reduced pressure. Then, a radio frequency power is applied to the target member 25 to generate a plasma in the vicinity of the surface of the target member 25. At this time, the surface of the target member 25 is subjected to sputtering by argon ions colliding against the target member 25. As a result, a dielectric film is deposited on the reflective end facets 10b of the laser device prototype 10A placed on the anode 24. In the first embodiment, three pairs of unit reflective films 130 made up of the low- and high-refractive-index films 13a and 13b of silicon dioxide and niobium oxide, respectively, are formed, for example.

The low-refractive-index film 13b is deposited by a reactive sputtering process using silicon (Si) for the target member 25, argon (Ar) for plasma generating gas, and oxygen ($O_2$) for the reactive gas.

On the other hand, where the high-refractive-index film 13b is deposited by subjecting the target member 25 of niobium oxide to sputtering using argon ions, the mole fraction of oxygen in the niobium oxide film deposited is likely lower than that defined by stoichiometry. Accordingly, to prevent this deficiency of oxygen in niobium oxide, an oxygen gas is preferably introduced along with the argon gas during the deposition process.

In this embodiment, the flow rate of argon supplied is set to about 10 sccm (standard cubic centimeter per minute) and the flow rate of oxygen supplied is set to about 40 sccm. In addition, the pressure inside the deposition chamber 23 is set to about 0.1 Pa and the radio frequency power is set to about 1 kw during the deposition process. On these conditions, a high-refractive-index film 13b of niobium oxide can be deposited at a deposition rate of about 8 nm/min with substantially no oxygen deficiency produced.

Niobium oxide is used for the target member 25 to deposit the high-refractive-index film 13b. Alternatively, the film may be deposited by a reactive sputtering process using metal niobium (Nb) for the target member 25 and an oxygen gas as a reactive gas.

Further, the end facet reflective film 13 is preferably deposited in vacuo throughout the process to prevent the contamination of the interface between the low- and high-refractive-index films 13a and 13b of silicon dioxide and niobium oxide, respectively. For this purpose, it is preferable to use a sputtering system with a multi-chamber structure including two deposition chambers for silicon dioxide and niobium oxide, respectively, or a sputtering system with a multi-source structure in which source materials for silicon dioxide and niobium oxide, are prepared in one deposition chamber.

As described above, a dielectric film with a low absorption coefficient and a high refractive index can be deposited relatively easily by using niobium oxide ($Nb_2O_5$). Thus, this material is easily applicable not only to the violet-light-emitting semiconductor laser device but also to laser devices, e.g., a red-light-emitting semiconductor laser device, that emit laser light in other wavelength parts of the spectrum.

Figure 3A:
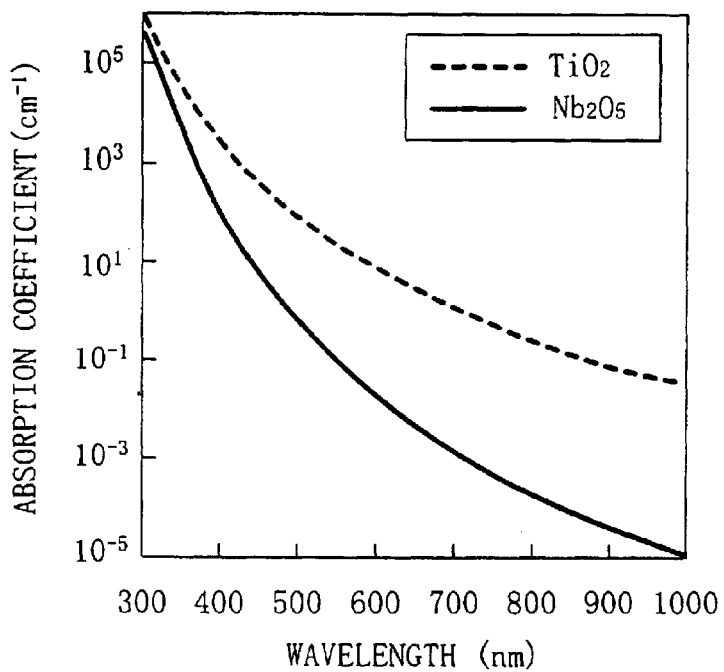
FIGS. 3(*a*) and 3(*b*) show the wavelength dependence of a high-refractive-index film in an end facet reflective film for the violet-light-emitting laser device according to the first embodiment of the present invention.
Figure 3B:
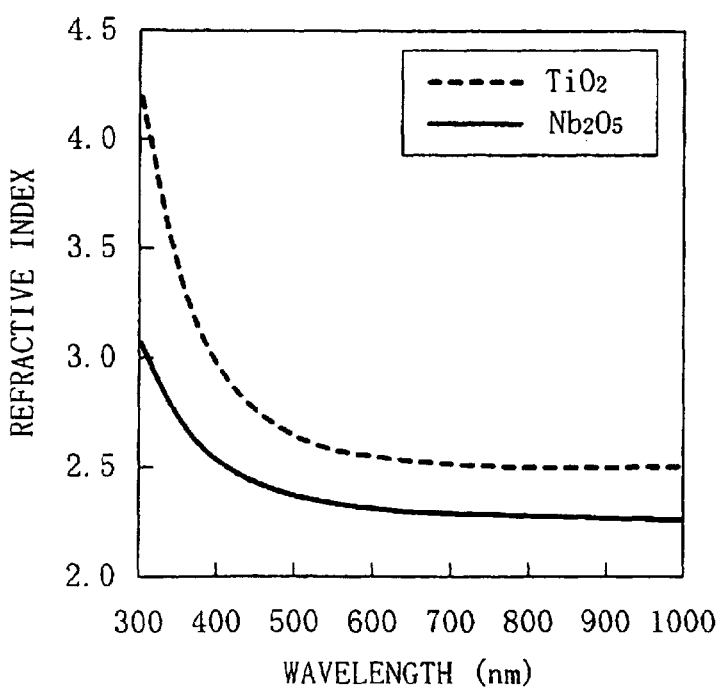

FIGS. 3(a) and 3(b) show results of evaluations that were obtained using a spectroscopic ellipsometry. Specifically, FIGS. 3(a) and 3(b) illustrate the wavelength distributions of light absorption coefficient and refractive index for the high-refractive-index film of niobium oxide according to the first embodiment and a comparative high-refractive-index film of titanium oxide deposited by a reactive sputtering process.

As shown in FIG. 3(a), as the wavelength decreases the absorption coefficient of niobium oxide, indicated by the solid line, increases monotonically but is much smaller than that of titanium oxide as indicated by the broken line. Comparing the absorption coefficients thereof at a wavelength of, e.g., 400 nm, it can be seen that the absorption coefficient of titanium oxide is 2400 $cm^{-1}$ while that of niobium oxide is 109 $cm^{-1}$.

On the other hand, as the wavelength decreases the refractive index of niobium oxide increases monotonically as shown in FIG. 3(b) but is somewhat smaller than that of titanium oxide. As can be seen, titanium oxide has a greater refractive index than that of niobium oxide. Comparing the refractive indexes thereof at a wavelength of, e.g., 400 nm, the refractive index of titanium oxide is 2.95 while that of niobium oxide is 2.52.

In general, a laser device deteriorates non-negligibly due to light absorption in a situation where the light absorption coefficient is $10^3$ $cm^{-1}$ to $10^4$ $cm^{-1}$ or more. Supposing a wavelength range corresponding to a light absorption coefficient of $10^4$ $cm^{-1}$ or less is applicable to a material for the end facet reflective film 13, titanium oxide cannot cope with various wavelengths of about 370 nm or less but niobium oxide can cope with various wavelengths no shorter than to about 340 nm.

As shown in FIG. 3(b), the refractive index of niobium oxide is somewhat smaller than that of titanium oxide but sufficiently greater than that of silicon dioxide ($SiO_2$) for the low-refractive-index film 13a. Thus, by using the unit reflective films 130 each made up of silicon dioxide and niobium oxide films, the end facet reflective film 13 can obtain a sufficiently high reflectance.

Figure 4:
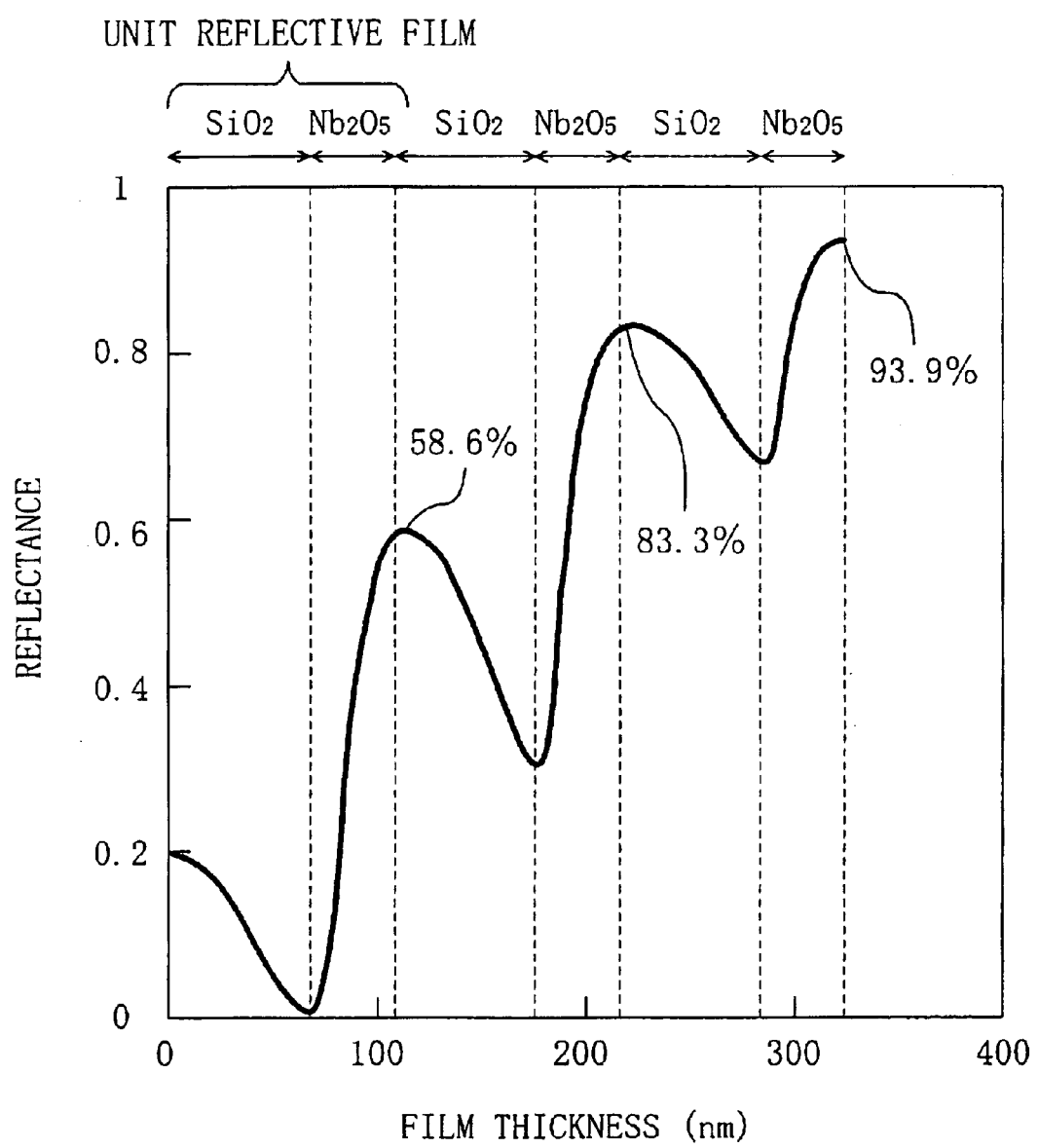
FIG. 4 is a graph showing how the reflectance of the end facet reflective film of the violet-light-emitting semiconductor laser device according, to the first embodiment of the present invention to light with a wavelength of 400 nm changes depending on the thickness thereof.

FIG. 4 shows how the reflectance of the end facet reflective film of the semiconductor laser device according to the first embodiment to the light with a wavelength of 400 nm changes depending on the thickness thereof. In this case, three pairs of unit reflective films 130, each of which is made up of the low-refractive-index film 13a of silicon dioxide with a thickness of about 68 nm determined by $\lambda/4n_1$ and the high-refractive-index film 13b of niobium oxide with a thickness of about 40 nm determined by $\lambda/4n_2$, are stacked, thereby obtaining the end facet reflective film 13 with a reflectance of about 93.9%, where $\lambda$ is 400 nm, $n_1$ is the refractive index of silicon dioxide at the wavelength of 400 nm, and $n_2$ is the refractive index of niobium oxide at the wavelength of 400 nm.

In the first embodiment, a magnetron sputtering system is used in a deposition process for the niobium oxide film. Alternatively, ECR, radio frequency or helicon sputtering systems may also be used.

If the unit reflective film 130, made up of the low- and high-refractive-index films 13a and 13b, has had one of its low-refractive-index films 13a formed on the end facet, a difference in refractive index will be caused between the low-refractive-index film 13a and a semiconductor layer in contact with the film 13a. As a result, the reflectance of the unit reflective film 130 increases. However, although the reflectance decreases one of the high-refractive-index films 13b may provided on the end facet, or each of the innermost and outermost unit reflective films 130 may terminate with just one of the two types of films, i.e., the low- or high-refractive-index films 13a or 13b may be provided as innermost and outermost films. Even so, the effects of the present invention will not be lost.

Further, silicon dioxide is used for the low-refractive-index film 13a. Alternatively, aluminum oxide ($Al_2O_3$) may be used.

Furthermore, a silicon dioxide or aluminum oxide film with a low refractive index may also be provided as a passivation film on the light-emitting end facet 10a of the resonant cavity 12, i.e., opposite to the reflective end facet 10b.

In addition, a Group III–V nitride semiconductor, containing gallium nitride as a main component, is used a semiconductor material for the violet-light-emitting semiconductor laser device with an oscillation wavelength of about 400 nm. Alternatively, any Group II–VI compound semiconductors such as zinc selenide (ZnSe), zinc sulfide (ZnS) and zinc oxide(ZnO) may also be used.

Embodiment 2

Hereinafter, a second embodiment of the present invention will be described.

In the first embodiment described above, niobium oxide is used for the high-refractive-index film that can cope with the demand for decreased wavelength. On the other hand, the second embodiment is adapted to cope with the demand for increasing the output power of a semiconductor laser device with a long oscillation wavelength covering infrared to red parts of the spectrum.

For example, a laser device for a 16× CD-R, on which data can be written only once sixteen times faster than normal speed, should have an optical output of 150 mW in a pulsed drive mode at a duty cycle of 50% and 110 mW in a CW drive mode. Thus, the known end facet reflective film, which is made up of a low-refractive-index film of silicon dioxide and a high-refractive-index film of amorphous silicon, cannot attain sufficient reliability.

In view of this, in the second embodiment, first and second dielectric layers for an end facet reflective film are made of silicon dioxide ($SiO_2$) and niobium oxide ($Nb_2O_5$), respectively, thereby ensuring long-term reliability for an infrared- or red-light-emitting semiconductor laser device for the 16× CD-R.

Figure 5:
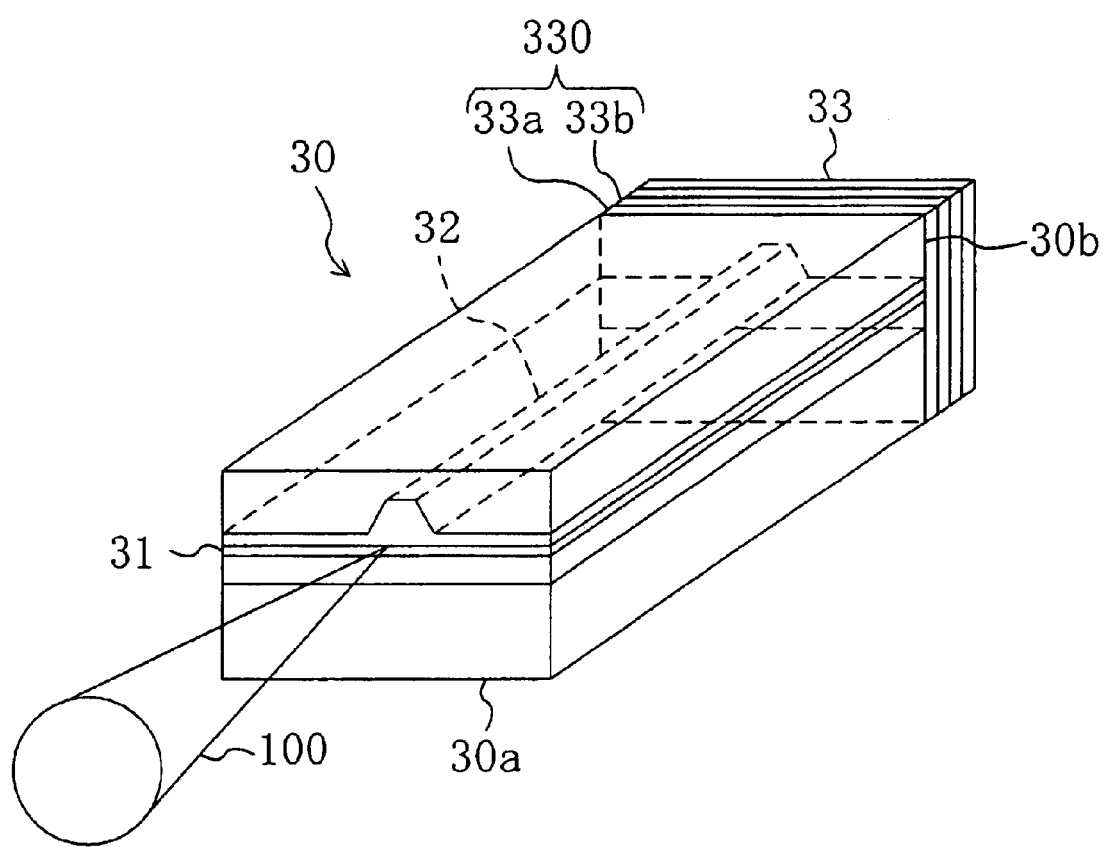
FIG. 5 is a perspective view showing an infrared- or red-light-emitting semiconductor laser device according to a second embodiment of the present invention.

FIG. 5 shows a semiconductor laser device according to the second embodiment of the present invention, which is an infrared- or red-light-emitting semiconductor laser device with an oscillation wavelength of about 780 nm.

As shown in FIG. 5, the semiconductor laser device 30 includes a resonant cavity 32 in which a quantum well active layer 31 made up of barrier layers of aluminum gallium arsenide (AlGaAs), for example, and well layers of gallium arsenide (GaAs), for example, is vertically sandwiched between at least light guide layers of n- and p-type aluminum gallium arsenide (AlGaAs), for example. The active layer also has a quantum well structure in the second embodiment but does not have to do so.

An end facet reflective film 33 is formed on a reflective end facet 30b opposite to a light-emitting end facet 30a for laser light 100 in the resonant cavity 32.

The end facet reflective film 33 has a structure including a plurality of unit reflective films 330, each of which is made up of a low-refractive-index film 33a of silicon dioxide as a first dielectric layer and a high-refractive-index film 33b of niobium oxide as a second dielectric layer. The low- and high-refractive-index films 33a and 33b are deposited in this order on the end facet of the resonant cavity 32.

The thicknesses of the low- and high-refractive-index films 33a and 33b and the number of unit reflective films 330 can be set to respective appropriate values according to the specifications of the semiconductor laser device. For example, if the silicon dioxide and niobium oxide films for two pairs of unit reflective films 330 are formed to have their thicknesses determined by $\lambda/4_1$ and $\lambda/4_2$, respectively, the end facet reflective film 33 can have a reflectance of about 85%.

According to the second embodiment, niobium oxide is used for the high-refractive-index film 33b of the end facet reflective film 33 formed on the reflective end facet 30b of the resonant cavity 32, and the light absorption coefficient of niobium oxide is smaller than that of amorphous silicon. Thus, a rise in temperature in the vicinity of the end facet of the resonant cavity 33 can be suppressed. As a result, the crystallinity of the quantum well active layer 31 and the surrounding portions thereof is less likely to deteriorate, and the semiconductor laser device can increase its output power.

This is because the light absorption coefficient of amorphous silicon to light with a wavelength of 780 nm is $4 \times 10^4$ $cm^{-1}$ while that of niobium oxide to light with a wavelength of 780 nm is substantially zero, i.e., $10^{-3}$ $cm^{-1}$ or less, and the absorption of light into the end facet reflective film 33 can be greatly reduced.

As a modified example for the second embodiment, amorphous silicon hydride ($\alpha$-Si:H), i.e., amorphous silicon containing hydrogen, may be used instead of niobium oxide for the high-refractive-index film 33b in the second unit for the end facet reflective film 33. Then, the end facet reflective film 33 can have its reflectance increased to about 90%.

In view of those points, to increase the output power of an infrared- or red-light-emitting semiconductor laser device, niobium oxide may be used for each of the high-refractive-index films 33b in the two pairs of unit reflective films 330, and the end facet reflective film 33 may be made up of three or more pairs of unit reflective films 330.

Where the output power does not have to be so high, (e.g., in a laser device for a 4× CD-R) a dielectric, having a refractive index greater than that of niobium oxide, may be used for the outer high-refractive-index films 33b in all unit reflective films 330, other than the first unit on the reflective end facet 30b, to obtain a high reflectance at a predetermined amount of current injected.

Embodiment 3

Hereinafter, a third embodiment of the present invention will be described with reference to the drawing.

Figure 6:
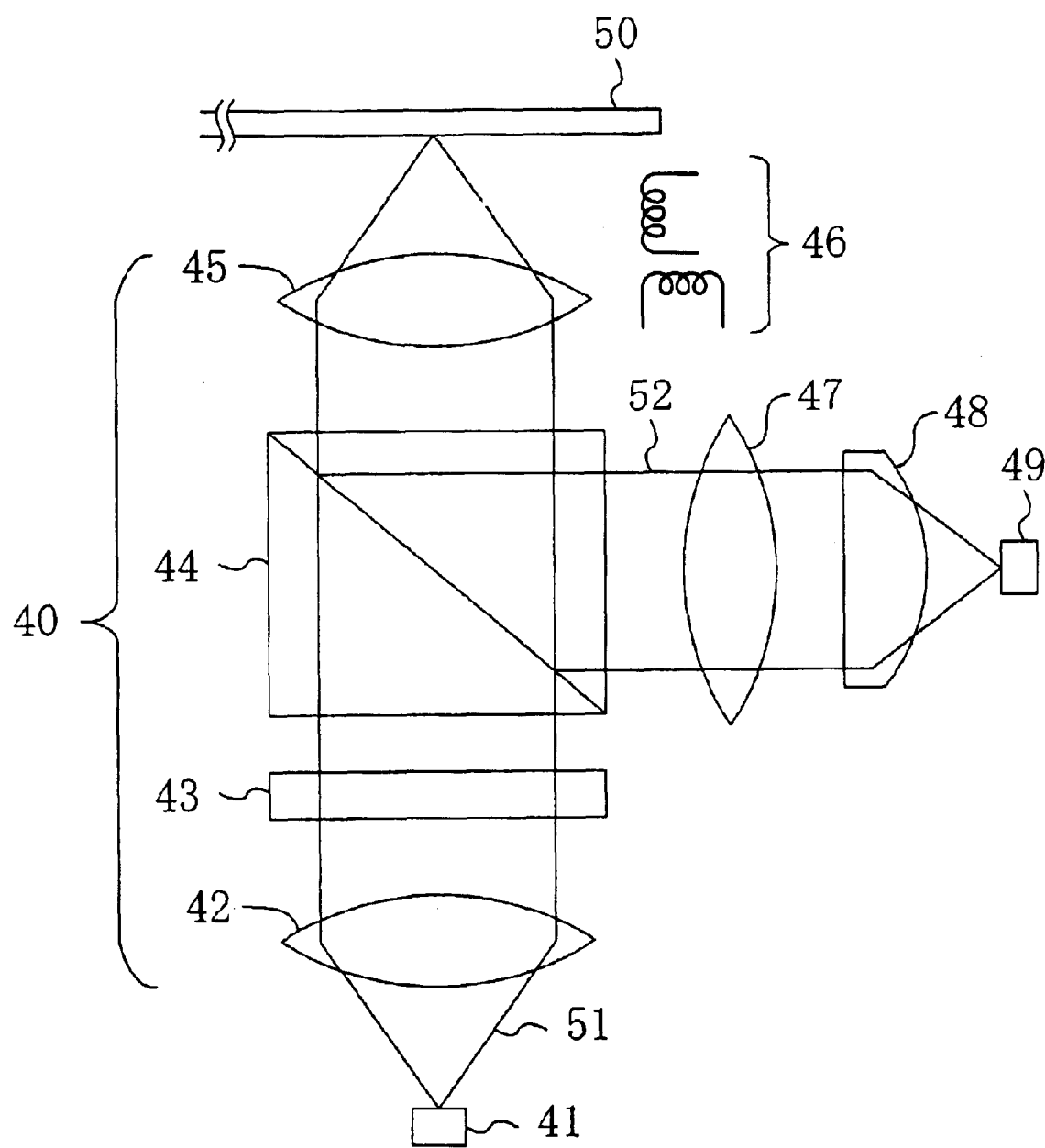
FIG. 6 is a schematic representation showing an arrangement for an optical disk apparatus according to a third embodiment of the present invention.

FIG. 6 schematically shows an arrangement for an optical disk apparatus according to the third embodiment of the present invention. In FIG. 6, in the optical disk apparatus according to the third embodiment, the semiconductor laser device of the present invention, i.e., the violet-light-emitting semiconductor laser device according to the first embodiment, is used as a light-emitter 41 of the optical disk apparatus.

As shown in FIG. 6, in the optical disk apparatus, the light-emitting end facet of the semiconductor laser device as the light-emitter 41 and the data-retaining surface of the optical disk 50 as a storage medium, on which desired data has been recorded, are disposed to face each other. A condensing optical system 40 is placed between the light-emitter 41 and the optical disk 50.

In the condensing optical system 40, collimator lens 42 that changes the light 51, emitted from the light-emitter 41, into parallel light; diffraction grating 43 that divides the parallel light into three beams (not shown); half prism 44 that transmits the emitted light 51 and changes the optical path of the light 52 reflected from the optical disk 50; and condenser lens 45 that focuses the three beams onto the optical disk 50, are arranged in this order so that the lens 42 is closest to the light-emitter 41. In the illustrated embodiment, laser light with a wavelength of about 400 nm is used as the emitted light 51.

Each of the three beams is focused onto the optical disk 50 is the shape of spot with a size of about 0.4 $\mu$m. A drive circuit 46 is provided to correct the radial shift of the optical disk 50 by adequately moving the condenser lens 45. The shift is detected based on the positions of the three spots.

A receiving lens 47 that condenses the reflected light 52; cylindrical lens 48 that detects a focus error; and photodiode 49 as a photodetector for converting the condensed reflected light 52 into an electrical signal are arranged on the optical path of the light 52 reflected from the half prism 44.

In this manner, the semiconductor laser device is used as the light-emitter 41 of the optical disk apparatus including: the condensing optical system 40 that guides the emitted-light 51 to the optical disk 50; and the photodiode 49 receiving the light 52 that has been reflected from the optical disk 50. In the laser device, niobium oxide, which has a light absorption coefficient smaller than that of amorphous silicon or titanium oxide, is used for the high-refractive-index film in the end facet reflective film formed on the end facet opposite to the light-emitting end facet. Thus, if the device should have an oscillation wavelength as short as about 400 nm or less, it is possible to ensure long-term reliability for the light-emitter 41, and eventually for the optical disk apparatus.

As a modified example of the third embodiment, if the infrared- or red-light-emitting semiconductor laser device according to the second embodiment is used as the semiconductor laser device as the light-emitter 41, the apparatus realizes long-term reliability as a 16× CD-ROM drive.

What is claimed is:

1. A semiconductor laser device comprising:
   a resonant cavity disposed between a n-type compound semiconductor layer and a p-type compound semiconductor layer, a light having a wavelength of 0.4 µm or less is emitted along the interfaces of the n-type compound semiconductor layer and the p-type compound semiconductor layer by applying a voltage to each compound semiconductor layer; and
   a reflective film adhered to an end facet of the resonant cavity,
   wherein the reflective film is composed of a first dielectric layer and a second dielectric layer, the second dielectric layer is made of niobium oxide.

2. The semiconductor laser device of claim 1, wherein the n-type compound semiconductor layer and the p-type semiconductor layer are made of Group III–V nitride semiconductors.

3. The semiconductor laser device of claim 1, wherein a refractive index of the second dielectric layer is greater than a refractive index of the first dielectric layer.

4. The semiconductor laser device of claim 1, wherein the first dielectric layer is made of silicon dioxide or aluminum oxide.

5. The semiconductor laser device of claim 3, wherein the n-type compound semiconductor layer and the p-type semiconductor layer are made of Group III–V nitride semiconductors.

6. The semiconductor laser device of claim 1, wherein the reflective film is formed by alternately laminating a plurality of first dielectric layers and a plurality of second dielectric layers containing niobium oxide.

7. The semiconductor laser device of claim 6, wherein the first dielectric layers are made of silicon dioxide or aluminum oxide.

8. The semiconductor laser device of claim 6, wherein the semiconductor layers are made of Group III–V nitride semiconductors.

9. A method for fabricating a semiconductor laser device, said method comprising the steps of:
   sequentially depositing a n-type compound semiconductor layer, a resonant cavity emitting a light having a wavelength of 0.4 µm or less, and a p-type compound semiconductor layer on a substrate;
   exposing an end facet of a resonant cavity in an emitting direction by cleaving or etching the; and
   forming a reflective film composed of a first dielectric layer and a second dielectric layer on the exposed end facet of the resonant cavity, the second dielectric layer is made of niobium oxide.

10. The method of claim 9, wherein the step of forming the reflective film includes the step of alternately depositing a plurality of first dielectric layers and a plurality of second dielectric layers containing niobium oxide.

11. The method of claim 9, wherein the reflective film is formed by a sputtering process or a reactive sputtering process.

12. The method of claim 9, wherein the n-type compound semiconductor layer and the p-type semiconductor layer are made of Group III–V nitride semiconductors.

13. An optical disk apparatus comprising:
   a light-emitter including the semiconductor laser device of claim 1;
   a condensing optical system that condenses laser light emitted from the light-emitter on a storage medium on which data has been recorded; and
   a photodetector that detects part of the laser light that has been reflected from the storage medium.

14. The semiconductor laser device of claim 1, further comprising a quantum well active layer sandwiched between the n-type compound semiconductor layer and the p-type compound semiconductor layer.

15. The semiconductor laser device of claim 14, wherein said quantum well active layer comprises a barrier layer and a well layer.

16. The semiconductor laser device of claim 14, wherein said reflective film is formed so as to be in direct contact with said quantum well active layer.

17. The method of claim 9, further comprising the step of depositing a quantum well active layer between the n-type compound semiconductor layer and the p-type compound semiconductor layer.

18. The method of claim 17, wherein said quantum well active layer comprises a barrier layer and a well layer.

19. The method of claim 17, wherein said reflective film is formed so as to be in direct contact with said quantum well active layer.

* * * * *

UNITED STATES PATENT AND TRADEMARK OFFICE
CERTIFICATE OF CORRECTION

PATENT NO.    : 6,798,811 B1
DATED         : September 28, 2004
INVENTOR(S)   : Gaku Sugahara et al.

It is certified that error appears in the above-identified patent and that said Letters Patent is hereby corrected as shown below:

Column 12,
Line 11, after the phrase "cleaving or etching the", insert the word -- substrate --.

Signed and Sealed this

Eleventh Day of January, 2005

JON W. DUDAS
*Director of the United States Patent and Trademark Office*